(12) United States Patent  
Hayashi et al.

(10) Patent No.: US 6,903,908 B2  
(45) Date of Patent: Jun. 7, 2005

(54) MAGNETORESISTIVE EFFECT SENSOR WITH BARRIER LAYER SMOOTHED BY COMPOSITION OF LOWER SHIELD LAYER

(75) Inventors: Kazuhiko Hayashi, Tokyo (JP); Keishi Ohashi, Tokyo (JP); Nobuyuki Ishiwata, Tokyo (JP); Masafumi Nakada, Tokyo (JP); Eizo Fukami, Tokyo (JP); Kiyokazu Nagahara, Tokyo (JP); Hiroaki Honjo, Tokyo (JP); Junichi Fujikata, Tokyo (JP); Kunihiko Ishihara, Tokyo (JP); Shigeru Mori, Tokyo (JP)

(73) Assignee: NEC Corporation, Tokyo (JP)

( * ) Notice: Subject to any disclaimer, the term of this patent is extended or adjusted under 35 U.S.C. 154(b) by 220 days.

(21) Appl. No.: 09/853,622

(22) Filed: May 14, 2001

(65) Prior Publication Data

US 2002/0008016 A1 Jan. 24, 2002

(30) Foreign Application Priority Data

May 15, 2000 (JP) ........................................ 2000-142527

(51) Int. Cl.⁷ .............................. G11B 5/39; G11B 5/11
(52) U.S. Cl. .................................... 360/324.2; 360/319
(58) Field of Search ............................... 360/324.2, 319

(56) References Cited

U.S. PATENT DOCUMENTS 5,898,548 A * 4/1999 Dill et al. ................ 360/324.2
6,125,009 A * 9/2000 Ishiwata et al. ............ 360/319
6,452,204 B1 * 9/2002 Ishiwata et al. ......... 360/324.2
6,490,139 B1 * 12/2002 Hayashi et al. ............. 360/322

FOREIGN PATENT DOCUMENTS

| JP | 10-163544 | 6/1998 |
| JP | 11-213349 | 8/1999 |
| JP | 11-316919 | 11/1999 |
| JP | 2000-11333 | 1/2000 |
| JP | 2000-101164 | 4/2000 |

OTHER PUBLICATIONS

Japanese Office Action dated Jan. 25, 2005 with English translation of pertinent portions.

* cited by examiner

*Primary Examiner*—Craig A. Renner  
(74) *Attorney, Agent, or Firm*—Whitham, Curtis & Christofferson, PC

(57) ABSTRACT

A magnetoresistive effect sensor uses a shielded-type magnetoresistive effect element using a magnetoresistive effect film formed by a basic configuration of a combination of a free layer, a barrier layer formed on the free layer, and a fixed layer formed on the barrier layer, wherein a sensing current flows substantially perpendicular to the magnetoresistive effect film, and wherein an amorphous material or a microcrystalline material is used in a lower shield.

7 Claims, 8 Drawing Sheets

LOWER SHIELD AND LOWER CONDUCTOR
LAYER FORMED AS FILMS AND PATTERNED
(PR FORMATION → PR REMOVAL)

VERTICAL BIAS LAYER BASE LAYER/VERTICAL
BIAS LAYER FILM FORMATION AND PATTERNING
(PR FORMATION → PR REMOVAL)

MAGNETORESISTIVE EFFECT FILM → PR FORMATION → MILLING → INSULATION FILM FORMATION → LIFT-OFF

UPPER SGIELD FORMATION → PR FORMATION → PATTERNING → PR REMOVAL

LOWER ELECTRODE HOLE FORMATION, ELECTRODE TERMINAL FORMATION

RECORDING HEAD FORMATION

ABS SURFACE; REMOVAL BY LAPPING UP TO HERE

FORMATION OF ABS SURFACE BY LAPPING

MAGNETORESISTIVE EFFECT SENSOR WITH BARRIER LAYER SMOOTHED BY COMPOSITION OF LOWER SHIELD LAYER

BACKGROUND OF THE INVENTION

1. Field of the Invention

The present invention relates to a magnetic sensor for the purpose of reading an information signal recorded onto a magnetic medium.

2. Related Art

In the prior art, there has been disclosure of a magnetic reading transducer called a magnetoresistive (MR) sensor or head, and it is known that this is capable of reading data from a magnetic surface with a high linear density.

An MR sensor detects a magnetic field signal by converting it to a change in resistance as a function of the strength and direction of magnetic flux sensed by a reading element. This MR sensor according to the prior art operates based on the anisotropic magnetoresistive (AMR) effect, whereby one component of the resistance of the reading element is proportional to cosine of the angle between the direction of magnetization and the direction of the detected current flowing in the element.

A detailed description of the AMR effect is found in D. A. Thompson et al "Memory Storage and Related Applications" IEEE Trans. on Mag. MAG-11, P. 1039 (1975).

In a magnetic head using the AMR effect, to suppress Barkhausen noise vertical bias is often applied, and there are cases in which FeMn, NiMn, or a nickel oxide or the like is used as a bias application material.

Additionally, there is a more prominent magnetoresistive effect, in which the change in resistance of a laminated magnetic sensor is attributed to spin-dependent transmission of conduction electrons between magnetic layers via a non-magnetic layer, and to spin-dependent scattering at the accompanying layer boundary.

This magnetoresistive effect is known variously as the "giant magnetoresistive" effect or "spin valve effect." Such a magnetoresistive sensor is made of an appropriate material, and exhibits a better sensitivity and larger resistance change than seen with a sensor using the AMR effect.

In this type of MR sensor, the internal planar resistance between a pair of ferromagnetic layers separated by a non-magnetic layer changes in proportion to the cosine of the angle between the magnetization directions of the two layers.

In the Japanese Unexamined patent publication (KOKAI) No. 2-61572, bearing a priority date of June 1988, there is language describing a laminated structure that yields a large MR effect occurring by virtue of anti-parallel arrangement of magnetization within a magnetic layer. Materials that can be used in this laminated structure are listed in the above-noted specification as ferromagnetic transition metals and alloys.

There is also disclosure of a structure in which there is the addition of a layer that fixes at least one of the ferromagnetic layers separated by an intermediate layer, and that FeMn is suitable for used as that layer.

In the Japanese Unexamined patent publication (KOKAI) No. 4-358310, bearing a priority date of Dec. 11, 1990, there is disclosure of an MR sensor having two thin-film ferromagnetic layers partitioned by a thin-film non-magnetic metal layer, wherein when the applied magnetic field is zero the magnetization directions of the two ferromagnetic thin-film layers are perpendicular, the resistance between two non-coupled ferromagnetic layers changing in proportion to the cosine of the angle between the magnetization directions of the two layers, this being independent of the direction of current flow in the sensor.

In the Japanese Unexamined patent publication (KOKAI) No. 4-103014, related to a patent application filed Aug. 22, 1990, there is language describing a ferromagnetic tunnel effect film, wherein in a multilayer ferromagnetic tunnel junction element in which an intermediate layer is interposed between ferromagnetic layers, and wherein a bias magnetic field is applied to at least one ferromagnetic layer from an anti-ferromagnetic material.

In the Japanese Unexamined patent publication (KOKAI) No. 10-162327, bearing a priority date of Nov. 27, 1996, there is language describing a magnetoresistive effect head structure using a ferromagnetic tunnel junction in the magnetic sensor section.

In the past, although an NiFe alloy has been used in the lower shield of a playback head using a ferromagnetic tunnel junction, even with an NiFe film of approximately 1 $\mu$m fabricated using sputtering, the crystal grains thereof are 20 nm or larger, resulting is great roughness, the average surface roughness value Ra measured using an AFM (atomic force microscope) being 3 nm or greater.

In the case of fabricating the NiFe using plating, the Ra value is double or more of the case of using sputtering. In the case of a ferromagnetic tunnel junction head (hereinafter referred to as a TMR head), the roughness in the barrier layer part of the TMR film is greatly influenced by the roughness of the layer immediately therebelow.

In a TMR head, the TMR film is either formed directly on the lower shield or formed on the lower shield with an intervening gap insulation layer or lower conductor layer formed on the lower shield, and if the roughness of the lower shield is excessive, the surface of the gap insulation layer or the lower conductor layer formed thereover will inherit this roughness.

In either case, this leads to an increase in the barrier layer roughness.

Even in the case in which the roughness of the lower shield is small, however, if the roughness of the gap insulation layer or lower conductor layer formed thereover is great, this also results in an increase in the roughness of the barrier layer in the TMR film. While in the past, aluminum was used for the lower conductor layer, in the case of a low-melting-point metal such as aluminum, because the crystal grain diameter is 20 nm or greater, the surface roughness has an Ra value of 3 nm or greater.

The problem that arises when the barrier layer roughness is large is that, in the TMR material the effective film thickness within the barrier layer becomes smaller.

As shown in FIG. 2 of the accompanying drawings, the tunnel transition probability of an electron in the TMR film passing through the barrier layer is greatly dependent upon minute changes in the barrier layer film thickness, and when the barrier layer effective film thickness exhibits a distribution, there is a tendency for electrons to concentrate in a location that has even a slightly smaller effective film thickness.

Given the above, not only does the junction resistance decrease, but also the current is concentrated in a location in which the effective film thickness is small, resulting in localized increases in voltage applied to the barrier layer, thereby increasing the dependency of the resistance change on the sensing current, and reducing the amount of resistance change compared to the case in which the sensing current is constant.

Additionally, there is a reduction in resistance change attributed to the thinning of the effective thickness of the barrier layer. With a decrease in the effective film thickness also comes an increase in the ferromagnetic coupling passing from the fixed layer to the free layer via the barrier layer.

Because the ferromagnetic coupling is an important factor in establishing the operating point of a magnetoresistive effect element, if this is excessively large, it is not possible to establish an appropriate operating point, resulting in the problems of a worsening of waveform asymmetry and reduction in output upon playback.

In addition to the above, in the Japanese examined patent publication (KOKOKU) No. 8-21166, the Japanese Unexamined patent publication (KOKAI) No. 5-217123, and Japanese patent number 2651015, there are disclosures of the configuration of magnetic heads. However, while the structure of these heads is described, there is in no case a disclosure of a technical configuration that smoothes the surface of the film component directly below the barrier layer in a compound-type magnetoresistive effect element.

In the Japanese Unexamined patent publication (KOKAI) No. 9-270321, while there is language describing the use of a amorphous component for the purpose of smoothing the surface of a soft magnetic shield layer, thereby improving the insulation of the insulation film, there is no language with regard to solving the problem of ferromagnetic coupling in the barrier layer of a compound-type magnetoresistive effect element.

In the Japanese Unexamined patent publication (KOKAI) No. 11-316919, although there is indication of the use of an amorphous alloy in the lower shield layer in a magnetic head using a compound-type magnetoresistive effect element, this is no more than a suggestion of the possibility of such use, and there is no disclosure of a technology to make the surface roughness of the barrier layer small.

Accordingly, it is an object of the present invention to improve on the above-noted drawbacks of the prior art, by providing a magnetoresistive effect sensor and a method for manufacturing a magnetoresistive effect sensor, wherein, by reducing the surface roughness in the barrier layer of a TMR film, playback waveform symmetry is maintained, while avoiding a reduction in output.

SUMMARY OF THE INVENTION

To achieve the above-noted objects, the present invention adopts the following basic technical constitution.

Specifically a first aspect of the present invention is a magnetoresistive effect sensor using a shielded-type magnetoresistive effect element using a magnetoresistive effect film having a basic configuration that is either a combination of a free layer, a barrier layer formed on the free layer, and a fixed layer formed on the barrier layer, or a combination of a fixed layer, a barrier layer formed on the fixed layer, and a free layer formed on the barrier layer, wherein a sensing current flows substantially perpendicularly with respect to the magnetoresistive effect film, and wherein either an amorphous material or a microcrystalline material is used in a lower shield layer.

A second aspect of the present invention is a magnetoresistive effect element in which a conductor layer is disposed at a bottom part of a magnetoresistive effect film having a basic configuration that is either a combination of a free layer, a barrier layer formed on said free layer, and a fixed layer formed on the barrier layer, or a combination of a fixed layer, a barrier layer formed on the fixed layer, and a free layer formed on the barrier layer, in contact either with an intervening base layer or directly therewith, wherein the lower conductor layer functions as a lower electrode to cause a sensing current to flow in the magnetoresistive effect film, and further wherein a lower conductor is made of a material selecting from a group consisting of an amorphous material and a microcrystal.

A third aspect of the present invention is a magnetoresistive effect sensor wherein a shielded-type magnetoresistive effect element is formed using a magnetoresistive effect film having a basic configuration that is either a combination of a free layer, a barrier layer formed on the free layer, and a fixed layer formed on the barrier layer, or a combination of a fixed layer, a barrier layer formed on the fixed layer, and a free layer formed on the barrier layer, wherein a sensing current flows substantially perpendicularly with respect to the magnetoresistive effect film, and wherein either an amorphous material or a microcrystalline material is used in a lower shield layer.

A fourth aspect of the present invention is a method for manufacturing a magnetoresistive effect sensor wherein a magnetoresistive effect film having a basic configuration that is either the combination of a free layer, a barrier layer formed on the free layer, and a fixed layer formed on the barrier layer, or a combination of a fixed layer, a barrier layer formed on the fixed layer, and a free layer formed on the barrier layer, which is formed on a lower conductor layer so as to make contact via a base layer or directly, without an intervening base layer, on a conductor layer, the lower conductor layer being made of either an amorphous material or a microcrystalline material.

By adopting the above-described constitution, a magnetoresistive effect sensor and a method for manufacturing a magnetoresistive effect sensor according to the present invention enable the achievement of a magnetoresistive effect sensor having, compared to the prior art, improved values of playback output, S/N ratio, and bit error rate, and it is possible using this magnetoresistive effect sensor to obtain a playback head and recording and playback system having improved values of playback output, S/N, and bit error rate.

In particular, the constitution of the present invention was adopted by knowing the extreme importance of forming the layer directly below the barrier layer so as to be as smooth as possible and flat.

It is a feature of the configuration of the magnetoresistive effect sensor and a method for manufacturing same according to the present invention, as noted above, that an amorphous material or microcrystalline material is used in the lower shield.

Additionally, in the present invention it is desirable that the crystal grain diameter in the microcrystal of the lower shield be 5.4 nm or smaller, and further that the lower shield be formed by sputtering.

It is preferable that the magnetoresistive effect film pattern be formed so that the magnetoresistive effect element is formed on the lower shield so as to come into contact therewith via a base layer or directly, and in another form of the present invention, it is desirable that a conductor pattern be disposed below the base layer of the magnetoresistive effect film, the bottom part of the conductor pattern thereof being in contact with the lower shield.

Alternately, the lower conductor layer functions as a lower electrode that causes a sensing current to flow in the magnetoresistive effect film, the lower conductor layer being made of either an amorphous material or a microcrystalline material. It is desirable that the crystal grain diameter in the microcrystal forming the lower conductor layer be 5.4 nm or smaller. Additionally, the lower conductor layer is formed by sputtering.

As discussed above, when the surface roughness of the lower shield or the lower conductor becomes large, there is a worsening of the roughness of the TMR film barrier layer formed thereover, thereby causing a deterioration of the magnetoresistive characteristics, resistance characteristics, and magnetic characteristics. To solve this problem, it is effective to make the lower shield layer and lower conductor layer surface roughness as small as possible.

In doing this, making the crystal grain diameter in the material used for form the lower shield layer and the lower conductor layer small reduces the surface roughness. In the case in which the crystal grain diameter is large, there is a large difference in the directions of neighboring crystal grains, and it is thought that there is a commensurate increase in the energy stored at the grain boundaries. Amorphous material is the case in which the crystal grain diameter becomes extremely small, in which case the surface roughness is smaller than in the case of microcrystalline material.

DETAILED DESCRIPTION OF THE PREFERRED EMBODIMENTS

Embodiments of a magnetoresistive effect sensor and a method for manufacturing a magnetoresistive effect sensor according to the present invention are described in detail below, with references made to relevant accompanying drawings.

Figure 1:
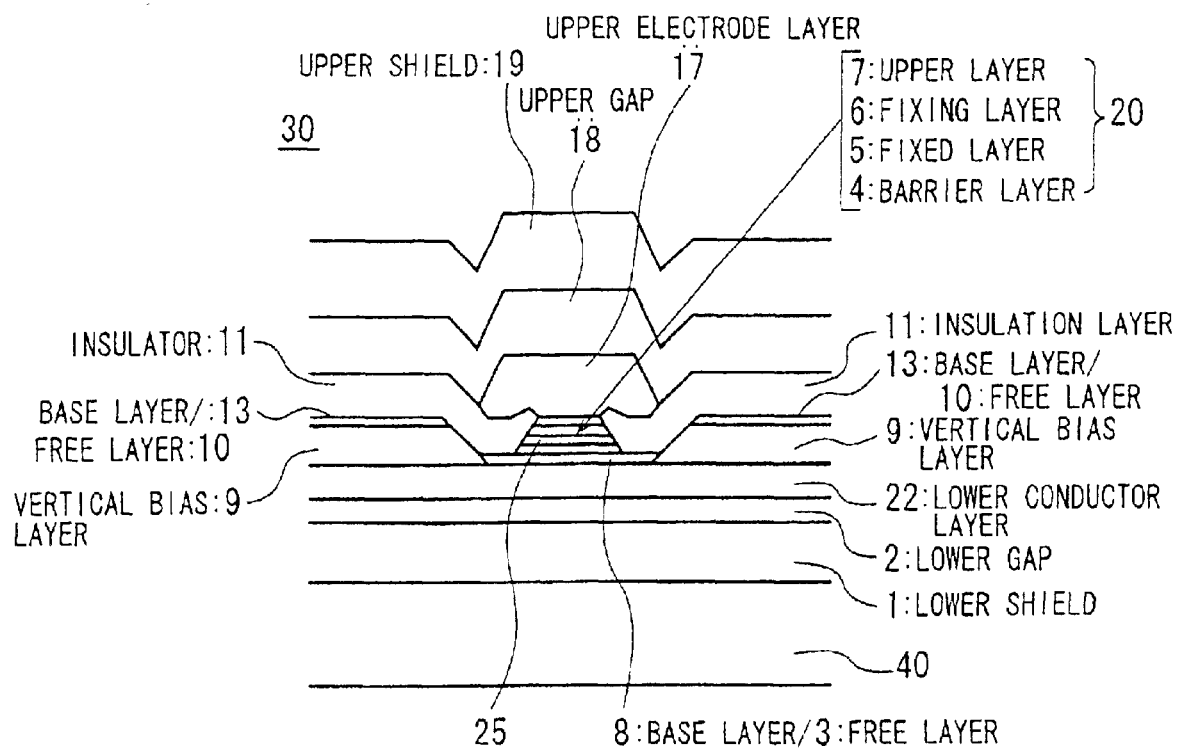
FIG. 1 is a cross-sectional view of the ABS surface, illustrating the configuration of a first embodiment of a magnetoresistive effect sensor according to the present invention.
Figure 2:
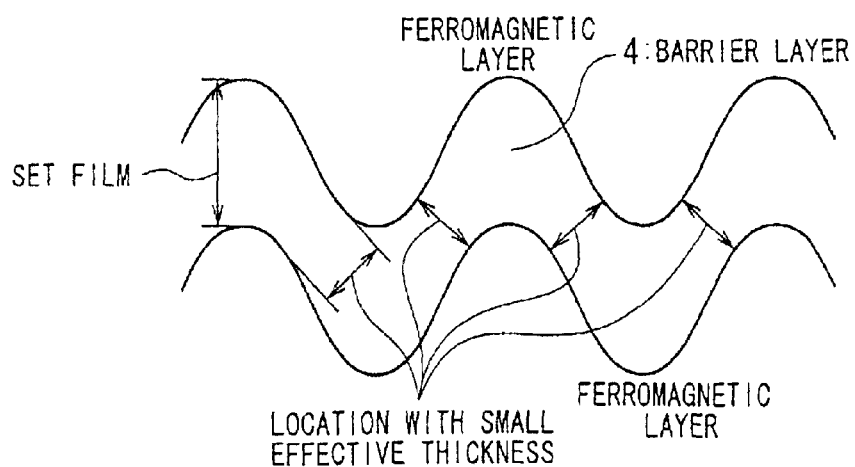
FIG. 2 is a drawing illustrating problems in a magnetoresistive effect sensor of the past.

Specifically, FIG. 1 is a drawing showing the configuration of an embodiment of a magnetoresistive effect sensor according to the present invention, this drawing showing a magnetoresistive effect sensor 30 using a shielded-type magnetoresistive effect element 25 using a magnetoresistive effect film 20 with a basic configuration that is a combination of a free layer 3, a barrier layer 4 formed on the free layer 3, and a fixed layer 5 formed on the barrier layer 4, wherein a sensing current flows substantially perpendicularly to the magnetoresistive effect film, and wherein amorphous material or a microcrystalline material is used in a lower shield 1.

Figure 3:
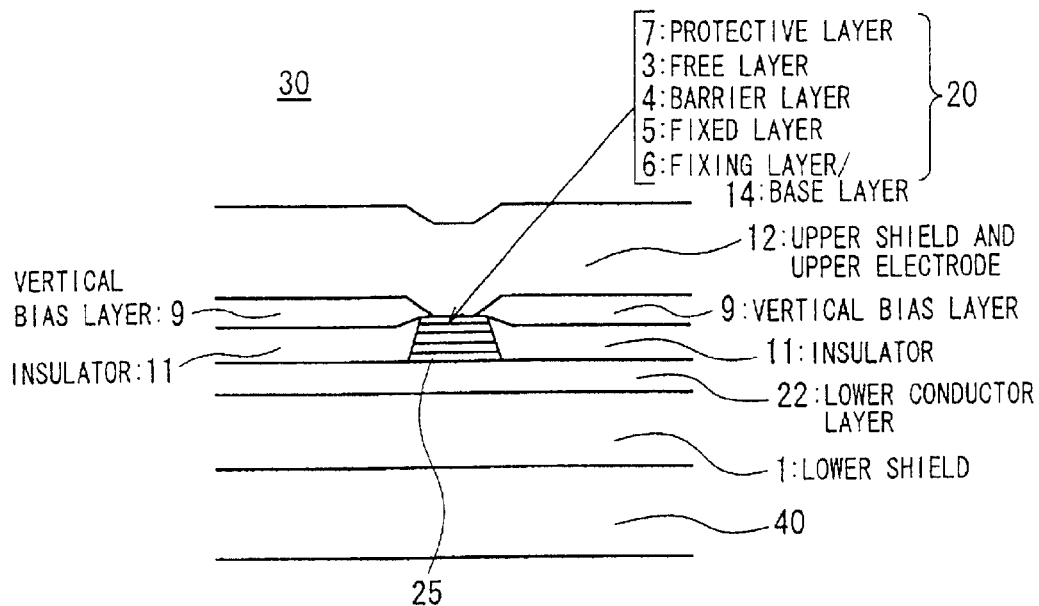
FIG. 3 is a cross-sectional view of the ABS surface, illustrating the configuration of a second embodiment of a magnetoresistive effect sensor according to the present invention.

FIG. 3 shows the configuration of another embodiment of the present invention, this drawing showing a magnetoresistive effect sensor 30 using a shielded-type magnetoresistive effect element 25 using a magnetoresistive effect film 20 with a basic configuration that is a combination of a fixed layer 5, a barrier layer 4 formed on the fixed layer 5, and a free layer 3 formed on the barrier layer 4, wherein a sensing current flows substantially perpendicularly to the magnetoresistive effect film, and wherein amorphous material or a microcrystalline material is used in a lower shield 1.

In the above-noted embodiments of the present invention, it is desirable that the crystal grain diameter in the microcrystal used in the lower shield 1 be 6.2 nm or smaller.

In the above-noted embodiments of the present invention, it is preferable that the lower shield 1 be formed by sputtering.

Describing the above-noted embodiments of the present invention in further detail, FIG. 1 is a conceptual drawing of a typical shielded-type sensor to which the present invention can be applied, viewed cut in a plane parallel the ABS plane.

In this configuration, there is a lamination onto a substrate 40 of a lower shield 1, a lower gap layer 2, and a lower conductor layer 22. Over this are successively laminated a base layer 8, a free layer 3, and a barrier layer 4.

In the part between the vertical bias layers 9 at the left and right on the barrier layer 4 are formed a fixed layer 5/fixing layer 6/upper layer 7, these being patterned as shown in the drawing.

An insulation layer 11 is disposed in the area surrounding the patterned barrier layer 4/fixed layer 5/fixing layer 6/upper layer 7. Further, an upper electrode layer 17, an upper gap layer 18, and an upper shield layer 19 are laminated thereonto.

In this configuration, the base layer 8/free layer 3/barrier layer 4/fixed layer 5/fixing layer 6/upper layer 7 constitute a magnetoresistive effect film 20. Where magnetoresistive effect film 20 includes base layer 8/free layer 3 as part of the film, base layer 13/free layer 10 are shown separately as patterned on vertical bias layer 9, as shown on FIGS. 1, 4 and 5.

In this structure, should an electrical current flow from the upper electrode 17 toward the lower electrode 22 as shown in the drawing, the current will pass in sequence from the upper electrode 17 to the upper layer 7, the fixing layer 6, the fixed layer 5, the barrier layer 4, the free layer 3, and the base layer 8, and finally to the lower electrode layer 22.

When this occurs, the vertical bias layer 9 does not contribute to the manner in which the current flows. Because the vertical bias pattern is disposed so as to be in contact with the free layer 10 pattern, the vertical bias thereof is sufficiently applied to the free layer. By using this structure, therefore, it is possible to have a sensing current flow properly through the magnetoresistive effect film part, and to properly apply vertical bias to the free layer 3.

While this embodiment shows the example in which both an upper gap 18 and lower gap 2 are provided, it is possible to omit one of these gap layers.

Additionally, while it is possible to use a structure in which a separate base layer 8 is additionally provided between the lower electrode layer 22 and the free layer 3, there are cases in which the lower base layer 8 is omitted.

As is described below, in another embodiment the lower conductor layer 22 is omitted.

While this embodiment of the present invention shows the patterning done up to the barrier layer lower edge when patterning is done of the magnetoresistive effect film 20, it is possible to appropriately select from the upper edge of the barrier layer 4 up to where on the lower edge of the free layer 3 the patterning is to be done. Additionally, it is not necessary to have the lower base layer 13 and free layer 10 on the vertical bias film layer 9.

Next, with regard to another embodiment of the magnetoresistive effect sensor 30 according to the present invention, in the structure shown in FIG. 3, a lower conductor layer 22 is formed on a lower shield 1 formed on the substrate 40, and over this is formed the pattern of the magnetoresistive effect film 20.

That is, the magnetoresistive effect film 20 is formed by the base layer 14/fixing layer 6, fixed layer 5/barrier layer 4/free layer 3/upper protective layer 7 structure. In this case the example shown is one in which the patterning is done to the bottommost layer of the magnetoresistive effect film 20, although it is possible to freely select how far patterning is to be done.

An insulator is formed around the magnetoresistive effect film pattern, and over this is formed a vertical bias pattern 9. Additionally, over this is formed an upper shield 12, which serves also as an upper electrode. Although the structure shown here is one in which the vertical bias pattern part makes contact with the magnetoresistive effect film pattern edge part, if these elements are brought into mutual proximity, it is not necessary for them to make direct contact with one another.

In this embodiment, the vertical bias layer 9 does not contribute to the manner in which current flows. Additionally, because the vertical bias pattern 9 is disposed in proximity to the free layer pattern 3, the vertical bias is sufficiently applied to the free layer 3.

By using this structure, therefore, it is possible to achieve proper flow of sensing current and to achieve proper application of vertical bias.

Additionally, although the FIG. 3 embodiment shows a structure in which the lower shied 1 and lower conductor layer 22 are in contact, it is possible to omit the lower conductor layer 22, and possible to provide a lower gap layer (as shown by item 2 on FIG. 1) between these two elements.

It is possible in the embodiment shown in FIG. 3 to provide an upper electrode layer ( as shown by item 17 on FIG. 1) between the upper shield 12 and the upper protective layer 7 on the magnetoresistive effect film 20, and it is further possible to provide an upper gap layer ( as shown by item 18 on FIG. 1 ) between the upper electrode layer ( as shown by item 17 on FIG. 1) and the upper shield 12.

It is also possible to omit the base layer 14 of the magnetoresistive effect film 20.

Another configuration of a magnetoresistive effect film 20 in this embodiment is formed by the base layer 14/free layer 3/barrier layer 4/fixed layer 5/fixing layer 6/upper layer 7.

Figure 4:
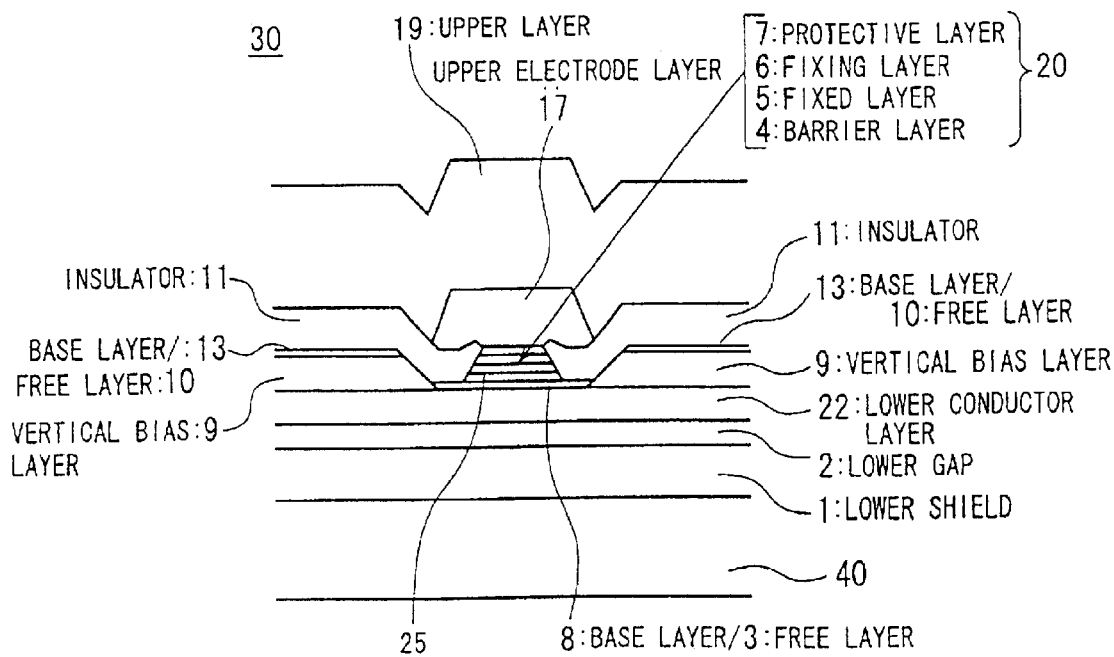
FIG. 4 is a cross-sectional view of the ABS surface, illustrating the configuration of a third embodiment of a magnetoresistive effect sensor according to the present invention.
Figure 5:
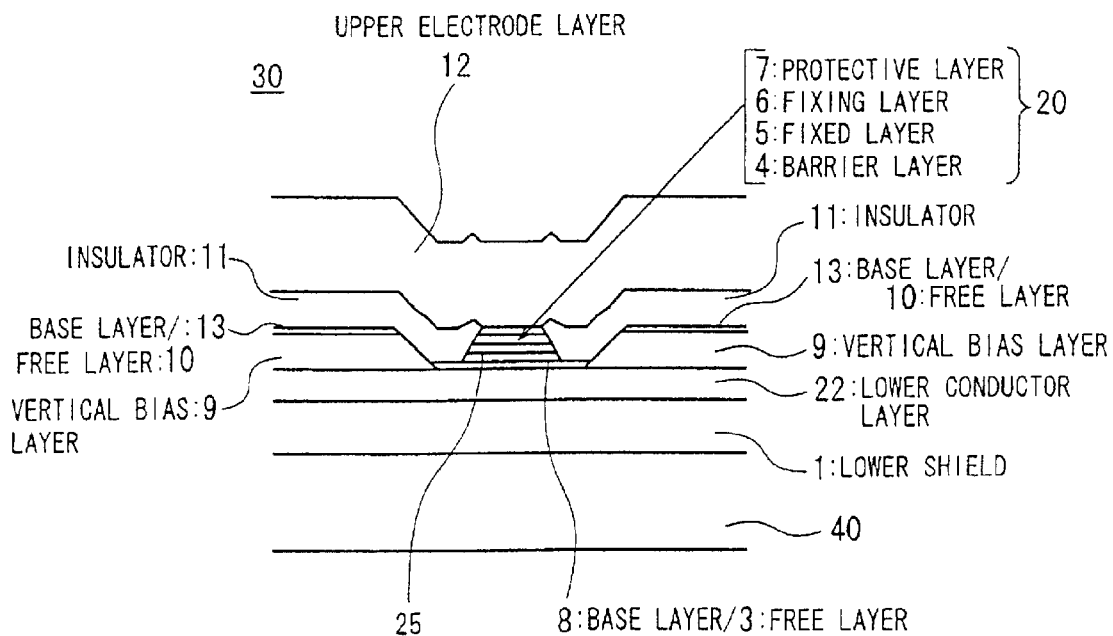
FIG. 5 is a cross-sectional view of the ABS surface, illustrating the configuration of a fourth embodiment of a magnetoresistive effect sensor according to the present invention.

Yet another embodiment of the magnetoresistive effect sensor 30 according to the present invention is a structure wherein the upper gap layer 18 is removed from the structure of FIG. 1, as shown in FIG. 4, and a structure wherein there is further omission from the structure of FIG. 1 of the upper shield layer 19, and the lower gap 2, as shown in FIG. 5, the upper shield layer serving as an upper electrode layer 12.

Figure 6:
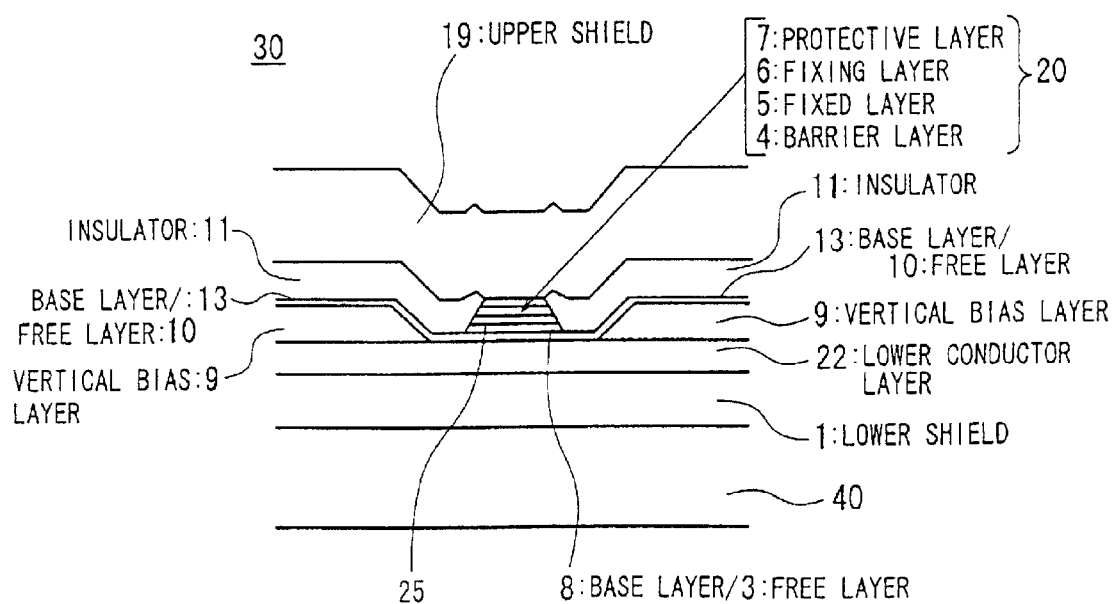
FIG. 6 is a cross-sectional view of the ABS surface, illustrating the configuration of a fifth embodiment of a magnetoresistive effect sensor according to the present invention.

FIG. 6 is a variation on FIG. 5, wherein the base layer 8 and free layer 3 are patterned onto the vertical bias layer 9 pattern.

Figure 8:
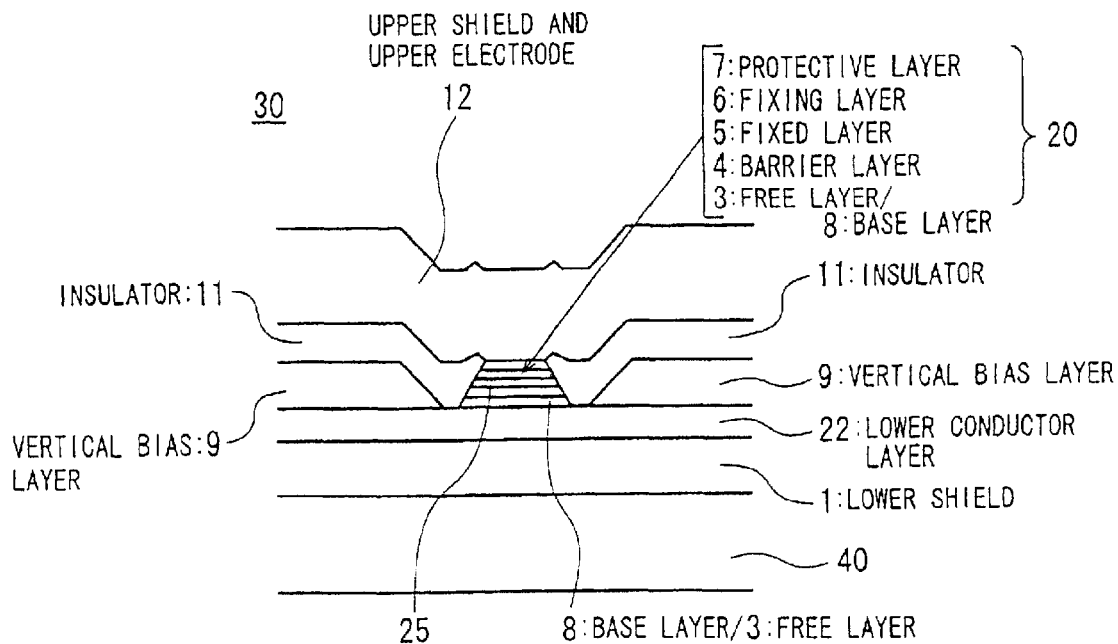
FIG. 8 is a cross-sectional view of the ABS surface, illustrating the configuration of a seventh embodiment of a magnetoresistive effect sensor according to the present invention.

FIG. 8 is a variation on FIG. 6, wherein in the TMR film pattern 20, because complete patterning of the film 20 is done to the lowermost edge of the free layer 3, the free layer 3 and vertical bias layer 9 are not in contact, which is different from the above-noted embodiments.

Of the base layer 8 and the free layer 3, the base can be left unpatterned. In this structure, although there is no contact between the free layer 3 and the vertical bias layer 9 pattern, if the free layer pattern edge part and the vertical bias pattern edge part are brought into sufficient proximity, it is possible to sufficiently apply vertical bias.

Figure 9:
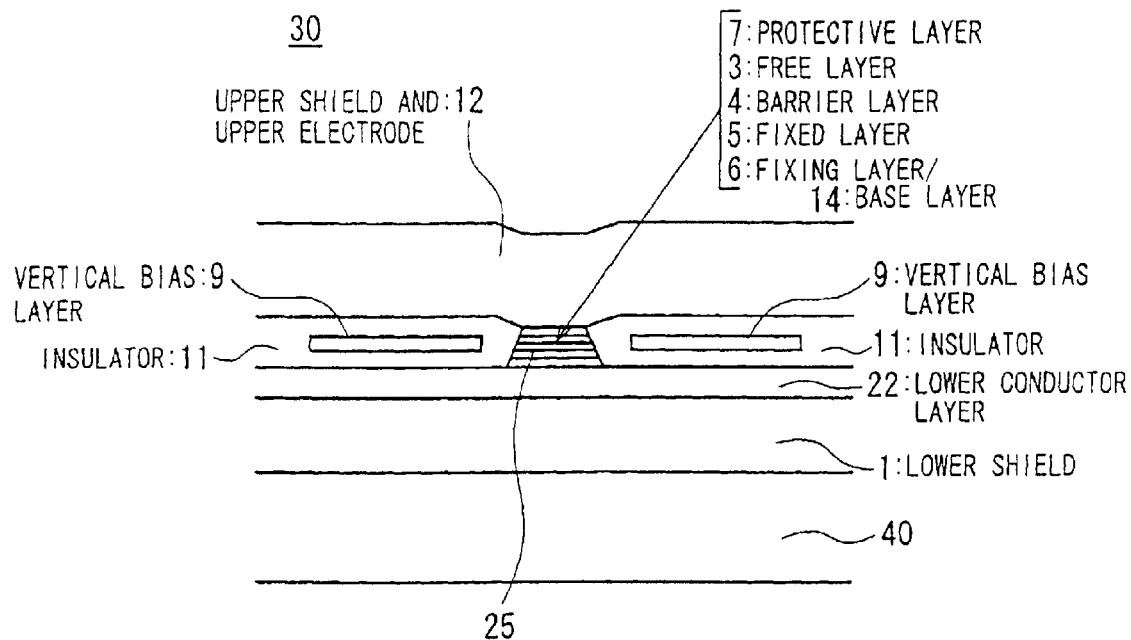
FIG. 9 is a cross-sectional view of the ABS surface, illustrating the configuration of a eighth embodiment of a magnetoresistive effect sensor according to the present invention.

Next, in the configuration of yet another embodiment of the magnetoresistive effect sensor 30 according to the present invention, as shown in FIG. 9, a lower electrode layer 22 is provided on the lower shield 1, and a magnetoresistive effect film 20 pattern is formed thereonto. The magnetoresistive effect film 20 is formed by a base layer 14/fixing layer 6/fixed layer 5/barrier layer 4/free layer 3/upper layer 7 structure.

In this embodiment of the present invention, the example shown is one in which the patterning is done to the lowermost layer of the magnetoresistive effect film 20, although it is also possible to selectively establish how far patterning is to be done. An insulator 11 is formed around the magnetoresistive effect film pattern, and over this is formed the vertical bias pattern 9.

Additionally, an upper shield 12, which serves also as an upper electrode, is formed-over the above-noted structure. Although this embodiment shows an example in which the vertical bias edge part and magnetoresistive effect film pattern edge part are in contact, if these are brought into mutual proximity, it is possible to have them separated from one another.

In the above-noted structure, the vertical bias layer 9 does not contribute to the manner in which current flows. Because the vertical bias pattern is provided in proximity to the free layer pattern, the vertical bias thereof is sufficiently applied to the free layer.

By using this structure, therefore, it is possible to achieve both proper flow of sensing current in the magnetoresistive effect film part and proper application of vertical bias to the free layer.

Additionally, in this embodiment, although the structure shown is one in which there is contact between the lower shield and the lower conductor layer, it is possible to omit the lower conductor layer 22, and also possible to provide a lower gap layer between these two elements.

It is also possible to provide an upper electrode layer between the upper layer 7 and the upper shield 12 of the magnetoresistive effect film 20, and further possible to provide an upper gap layer between the upper electrode layer and the upper shield.

Additionally, it is possible to omit the base layer 14 of the magnetoresistive effect film in this embodiment.

Figure 7:
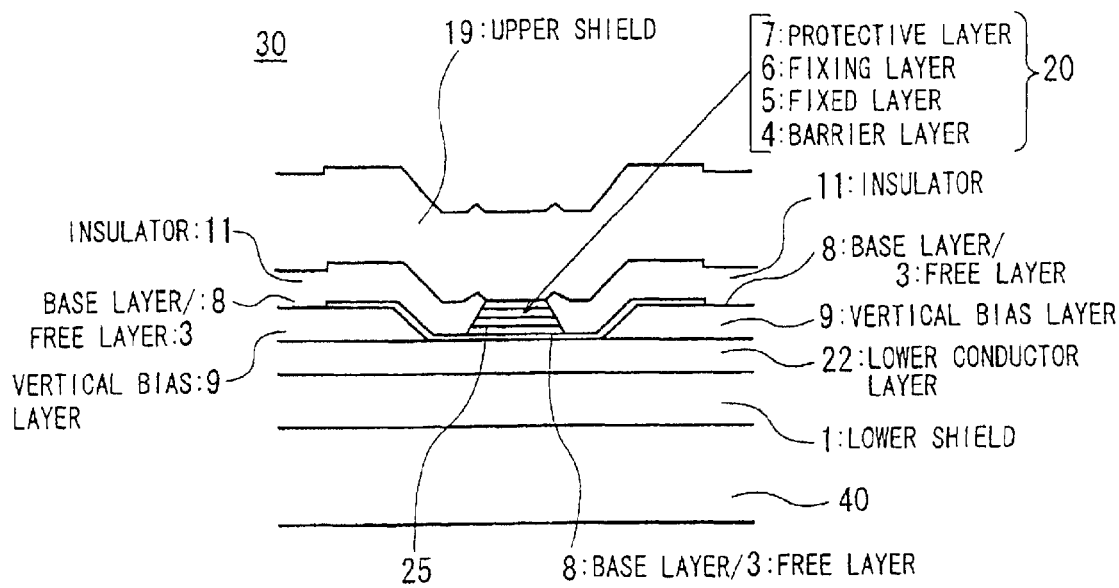
FIG. 7 is a cross-sectional view of the ABS surface, illustrating the configuration of a sixth embodiment of a magnetoresistive effect sensor according to the present invention.

In this embodiment, in place of the above-noted magnetoresistive effect film 20, it is possible to use a magnetoresistive effect film 20 that is formed, as shown in FIG. 7, by a base layer 8/free layer 3/barrier layer 4/fixed layer 5/fixing layer 6/upper layer 7 structure.

As noted above, in systematically summarizing the magnetoresistive effect sensor 30 according to the present invention, as shown in FIG. 5 or FIG. 3, in the magnetoresistive effect sensor 30, a magnetoresistive effect film 20 having a basic configuration that is either a combination of a free layer 3, a barrier layer 4 formed on the free layer 3, and a fixed layer 5 formed on the free layer 3 or a combination of a fixed layer 5, a barrier layer 4 formed on the fixed layer 5, and a free layer 3 formed on the barrier layer 4 is formed so as to make contact via base layers 8 and 14, or is formed directly on the lower shield 1.

In the configuration of another embodiment of a magnetoresistive effect sensor according to the present invention, as shown in FIG. 5 or FIG. 3, in the magnetoresistive effect sensor 30, a lower electrode layer 2 is disposed on the bottom parts of the base layers 8 and 14 of a magnetoresistive effect film 20 having a basic configuration that is either a combination of a free layer 3, a barrier layer 4 formed on the free layer 3, and a fixed layer 5 formed on the free layer 3 or a combination of a fixed layer 5, a barrier layer 4 formed on the fixed layer 5, and a free layer 3 formed on the barrier layer 4, and the bottom part of this lower electrode layer 2 is in contact with the lower shield 1.

In the configuration of yet another embodiment of the magnetoresistive effect sensor 30 according to the present invention, as shown in FIG. 1 and FIG. 2 to FIG. 9, in a magnetoresistive effect element 25 in which, at the bottom part of a magnetoresistive effect film 20 having a basic configuration that is either a combination of a free layer 6, a barrier layer 4 formed on the free layer 6, and a fixed layer 5 formed on the barrier layer 4, or a combination of a fixed layer 5, a barrier layer 4 formed on the fixed layer 5, and a free layer 3 formed on the barrier layer 4, a conductor layer 22 is disposed so as to make contact via the base layers 8 and 14 or disposed in direct contact, the lower electrode layer 22 functions as a lower electrode causing sensing current to flow in the magnetoresistive effect film 20, a lower conductor 22 or the lower shield 1 being made of either an amorphous material or a microcrystal.

That is, in this embodiment of the present invention, the lower shield 1 itself is made of conductive member, so that it can function as an electrode.

In the above-noted embodiment, it is preferable that the crystal grain diameter of the microcrystal forming the lower electrode layer 1 be 5.4 nm or smaller.

Additionally, it is desirable that the lower electrode layer 1 be formed by sputtering.

In this embodiment, if necessary, a magnetization-fixing layer 6, which fixes the magnetization of the fixed layer 5 is provided in contact with the fixed layer 5.

In the above-noted embodiment of the present invention, it is preferable that the crystal grain diameter of the microcrystal used in the lower shield 1 be 6.2 nm or smaller.

Additionally, in this embodiment it is preferable that when forming the lower shield layer, sputtering is used to form the shield layer.

The materials used for the various layers in manufacturing the magnetoresistive effect film 30 according to the present invention are described below.

As indicated below, the following elements are primary candidates for elements to use in each layer.

Base

Alumina-TiC, SiC, alumina, alumina-TiC/alumina, SiC/alumina

Lower Shield Layer

A single or multilayer film or mixture of CoZr, CoFeB, CoZrMo, CoZrNb, CoZr, CoZrTa, CoHf, CoTa, CoTaHf, CoNbHf, CoZrNb, CoHfPd, CoTaZrNb, CoZrMoNi alloy, FeAlSi, or metal nitride.

In particular, it is preferable that the lower shield be made of a material based on CoZrTa and CoZrTaCr alloy.

Lower Electrode Layer

Single or multilayer film or mixture of Au<Ag, Cu, Mo, W, Y, Ti, Zr, Hf, V, Cr, Mn, Nb, Tc, Ru, Rh, Pd, Re, Os, Ir, Ta, and Pt.

Upper Electrode Layer

Single or multilayer film or mixture of Au, Ag, Cu, Mo, W, Y, Ti, Zr, Hf, V, Cr, Mn, Nb, Tc, Ru, Rh, Pd, Re, Os, Ir, Ta, and Pt.

Upper Shield Layer

Single or multilayer film or mixture of NiFe, CoZr, CoFeB, CoZrMo, CoZrNb, CoZr, CoZrTa, CoHf, CoTa, CoTaHf, CoNbHf, CSoZrNb, CoHfPd, CoTaZrNb, CoZrMoNi alloy, FeAlSi, metal nitride, MiZn ferrite, NiZn ferrite, or MgZn ferrite.

Insulation Layer

Single or multilayer film or mixture of aluminum oxide, silicon oxide, aluminum nitride, silicon nitride, and diamond-like carbon.

Lower Gap Layer

Single or multilayer film or mixture of aluminum oxide, silicon oxide, aluminum nitride, silicon nitride, and diamond-like carbon.

Upper Gap Layer

Single or multilayer film or mixture of aluminum oxide, silicon oxide, aluminum nitride, silicon nitride, and diamond-like carbon.

Upper Layer

Single or multilayer film or mixture of Au, Ag, Cu, Mo, W, Y, Ti, Zr, Hf, V, Cr, Mn, Nb, Tc, Ru, Rh, Pd, Re, Os, Ir, Ta, and Pt.

Vertical Bias Layer

Single or multilayer or mixture of CoCrPt, CoCr, CoPt, CoCrTa, FeMn, NiMn, Ni oxide, NiCo oxide, Fe oxide, NiFe oxide, IrMn, PtMn, PtPdMn, ReMn, Co ferrite, and Ba ferrite.

The following configurations can be used as a magnetoresistive effect film.

Base/base layer/free layer/first MR enhancement layer/ barrier layer/second MR enhancement layer/fixed layer/fixing layer/protective layer Base/base layer/fixing layer/fixed layer/first M enhancement layer/barrier layer/second MR enhancement layer/free layer/protective layer Base/Laminate of N repetitions of (base layer/free layer/ first MR enhancement layer/barrier layer/second MR enhancement layer/fixed layer/fixing layer/protective layer)

Base/Laminate of N repetitions of (base layer/fixing layer/ fixed layer/first MR enhancement layer/barrier layer/ second MR enhancement layer/free layer/protective layer)

Base/base layer/first fixing layer/first fixed layer/first MR enhancement layer/barrier layer/second MR enhancement layer/free layer/third MR enhancement layer/ barrier layer/fourth MR enhancement layer/second fixed layer/second fixing layer/protective layer Base/base layer/laminate of N repetitions (where N is 1 or greater) of (fixed layer/first MR enhancement layer/ barrier layer/second MR enhancement layer/free layer/ barrier layer)/fixed layer/protective layer Base/base layer/laminate of N repetitions (where N is 1 or greater) of (free layer/first MR enhancement layer/ barrier layer/second MR enhancement layer/fixed layer/barrier layer) /free layer/protective layer Base/base layer/fixed layer/first MR enhancement layer/ barrier layer/second MR enhancement layer/free layer/ protective layer Base/base layer/free layer/first MR enhancement layer/ barrier layer/second MR enhancement layer/fixed layer/protective layer A single-layer film, mixture film, or multilayer film made of Ta, Hf, Zr, W, Cr, Ti, Mo, Pt, Ni, Ir, Cu, Ag, Co, Zn, Ru, Rh, Re, Au, Os, Pd, Nb, and V is used as the base layer. It is possible to use Ta, Hf, Zr, W, Cr, Ti, Mo, Pt, Ni, Ir, Cu, Ag, Co, Zn, Ru, Rh, Re, Au, Os, Pd, Nb, and V as added elements.

There are cases in which a base layer is not used.

It is possible to use an NiFe, CoFe, NiFeCo, FeCo, CoFeB, CoZrMo, CoZrNb, CoZr, CoZrTa, CoHf, CoTa, CoTaHf, CoNbHf, CoHfPd, CoTaZr, Nb, CoZrMoNi alloy or amorphous magnetic material as a free layer.

The candidates for a barrier layer material will differ between the case in which the magnetoresistive effect film is a ferromagnetic tunnel junction film and the case in which it is a magnetoresistive effect film using a conductive barrier layer as a barrier layer.

As a barrier layer for a ferromagnetic tunnel junction film, an oxide, nitride, or mixture of an oxide and nitride, or a metal/oxide two-layer film a metal/nitride two-layer film, or metal/(mixture of and oxide and a nitride) two-layer film.

Primary candidates are single or multilayer film or mixture of Ti, Vi, Cr, Co, Cu, Zn, Y, Zr, Nb, Mo, Tc, Ru, Rh, Pd, Ag, Hf, Ta, W, Re, Os, Ir, Pt, Au, Si, Al, Ti, Ta, Pt, Ni, Co, Re, and V or a laminate with a single or multilayer film, or mixture of these with oxides and nitrides of Ti, Vi, Cr, Co, Cu, Zn, Y, Zr, Nb, Mo, Tc, Ru, Rh, Pd, Ag, Hf, Ta, W, Re, Os, Ir, Pt, Au, Si, Al, Ti, Ta, Pt, Ni, Co, Re, and V.

In the case in which the magnetoresistive effect film uses a conductive barrier layer as a barrier layer, primary candidates are single or multilayer films or mixtures of Ti, V, Cr, Co, Cu, Zn, Y, Zr, Nb, Mo, Tc, Ru, Rh, Pd, Ag, Hf, Ta, W, Re, Os, Ir, Pt, Au, Si, Al, Ti, Ta, Pt, Ni, Co, Re, and V or a laminate with a single or multilayer film or mixture of these with Ti, V, Cr, Co, Cu, Zn, Y, Zr, Nb, Mo, Tc, Ru, Rh, Pd, Ag, Hf, Ta, W, Re, Os, Ir, Pt, Au, Si, Al, Ti, Ta, Pt, Ni, Co, Re, and V.

The first and second MR enhancement layers are disposed between the free layer and barrier layer and between the fixed layer and barrier layer, and are layers that make increase the value of the magnetoresistive change ratio.

The movement of this magnetization in the case of disposition between the free layer and the barrier layer is in part of the free layer, and for the case of disposition between the fixed layer and the barrier layer is in part of the fixed layer.

Primary candidates are Co, NiFeCo, or FeCo or the like, or CoFeB, CoZrMo, CoZrNb, CoZr, CoZrTa, CoHf, CoTa, CoTaHf, CoNbHf, CoZrNb, CoHfPd, CoTaZrNb, and CoZrMoNi alloy, or an amorphous material.

In the case in which an MR enhancement layer is not used, compared to the case in which it is used, there is a commensurate reduction in the number of manufacturing steps.

It is possible to use NiFe, CoFe, NiFeCo, FeCo, CoFeB, CoZrMo, CoZrNb, CoZr, CoZrTa, CoHf, CoTa, CoTaHf, CoNbHf, CoZrNb, CoHfPd, CaTaZrNb, and COZrMoNi alloy or an amorphous material as a fixed layer.

It is also possible to use combine the above with a single member, alloy, or laminate of a group based on Ti, V, Cr, Co, Cu, Zn, Y, Zr, Nb, Mo, Tc, Ru, Rh, Pd, Ag, Hf, Ta, W, Re, Os, Ir, Pt, Au, Si, Al, Ti, Ta, Pt, Ni, Co, Re, and V.

Of the laminates, primary candidates are Co/Ru/Co, CoFe/Ru/CoFe, CoFeNi/Ru/CoFeNi, Co/Cr/Co, CoFe/Cr/CoFe, and CoFeNi/Cr/CoFeNi.

It is possible to use FeMn, NiMn, IrMn, RhMn, PtPdMn, ReMn, PtMn, PtCrMn, CrMn, CrAl, TbCo, CoCr, CoCrPt, CoCrTa, PtCo and the like as a fixing layer.

Other primary candidates thereof are PtMn or material in which Ti, V, Cr, Co, Cu, Zn, Y, Zr, Nb, Mo, Tc, Ru, Rh, Pd, Ag, Hf, Ta, W, Re, Os, Ir, Pt, Au, Si, Al, Ti, or Ta are added to PtMn.

As a protective layer it is possible to use a single or multilayer film or mixture of Ti, V, Cr, Co, Cu, Zn, Y, Zr, Nb, Mo, Tc, Ru, Rh, Pd, Ag, Hf, Ta, W, Re, Os, Ir, Pt, Au, Si, Al, Ti, Ta, Pt, Ni, Co, Re, V, or a laminate of these with a single or multilayer film or mixture of Ti, V, Cr, Co, Cu, Zn, Y, Zr, Nb, Mo, Tc, Ru, Rh, Pd, Ag, Hf, Ta, W, Re, Os, Ir, Pt, Au, Si, Al, Ti, Ta, Pt, Ni, Co, Re, and V.

FIG. 10 to FIG. 13 show a representative example of the processes of manufacturing the structure shown in FIG. 6.

Figure 10A:
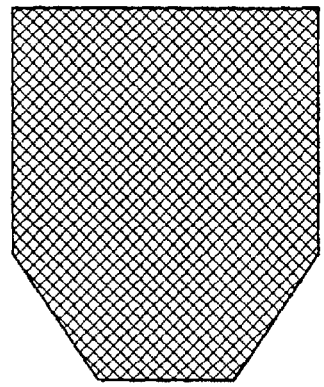
FIG. 10 is a plan view illustrating the configuration of an embodiment of a method for manufacturing a magnetoresistive effect sensor according to the present invention.
Figure 10B:
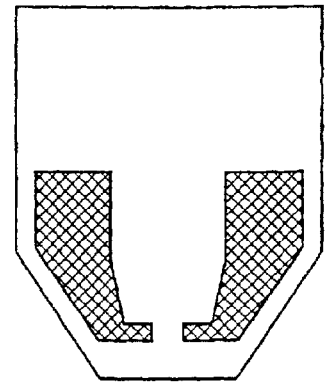

Specifically, first, as shown in FIG. 10(A), a lower shield layer 1 and lower electrode layer 22, which is a lower conductor layer, are formed as films on a substrate 40, after which patterning to a prescribed configuration is done and, as shown in FIG. 10(B), a vertical bias base layer and vertical bias layer 9 is formed as a film, this being patterned to a prescribed configuration (not shown in the drawing).

Figure 11A:
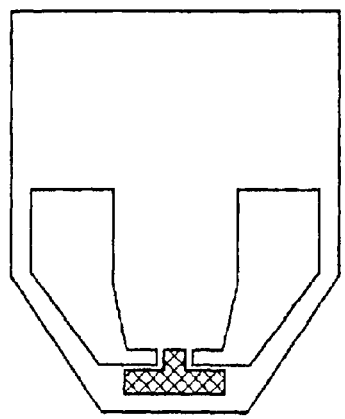
FIG. 11 is a plan view illustrating the configuration of an embodiment of a method for manufacturing a magnetoresistive effect sensor according to the present invention.
Figure 11B:
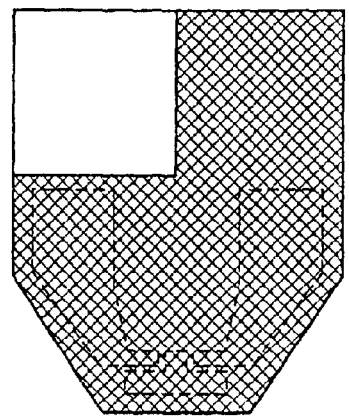

Next, as shown in FIG. 11(A), the magnetoresistive effect film 20 is sequentially formed in layers, and after a stencil PR is formed, milling is performed in order to achieve patterning. After this milling operation, the insulation film 11 is formed and lift-off is performed, after which, as shown in FIG. 11(B), PR formation is performed after forming the above-noted shield 19, the PR being removed after patterning as shown in the drawing.

Figure 12A:
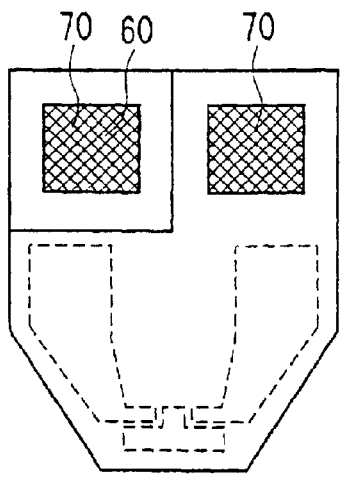
FIG. 12 is a plan view illustrating the configuration of an embodiment of a method for manufacturing a magnetoresistive effect sensor according to the present invention.
Figure 12B:
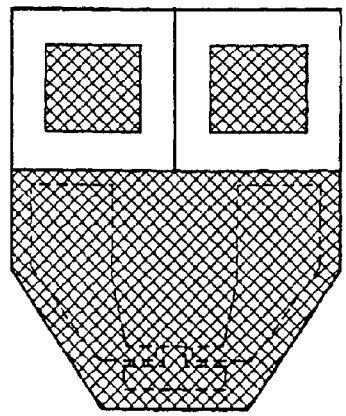
Figure 13:
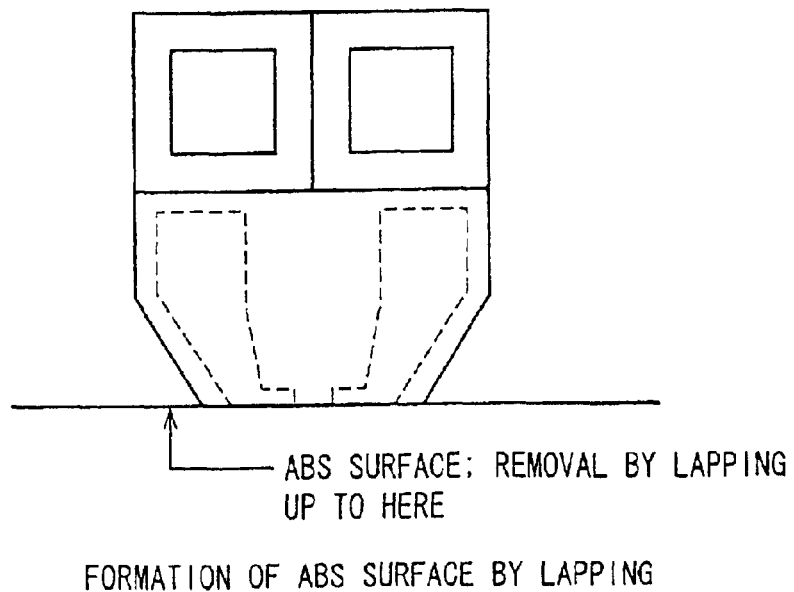
FIG. 13 is a plan view illustrating the configuration of an embodiment of a method for manufacturing a magnetoresistive effect sensor according to the present invention.

Next, as shown in FIG. 12(A), a hole 60 is formed in the insulation layer part until the lower electrode is exposed, thereby forming an electrode terminal 70. After this is done, as shown in FIG. 12(B), the recording head part is formed and, as shown in FIG. 13, finally the terminal part is lapped until an appropriate element height is achieved, exposing the ABS surface, and completing the fabrication of the head.

An example of application of the present invention to a recording and playback head and a recording and playback system is described below.

Figure 14:
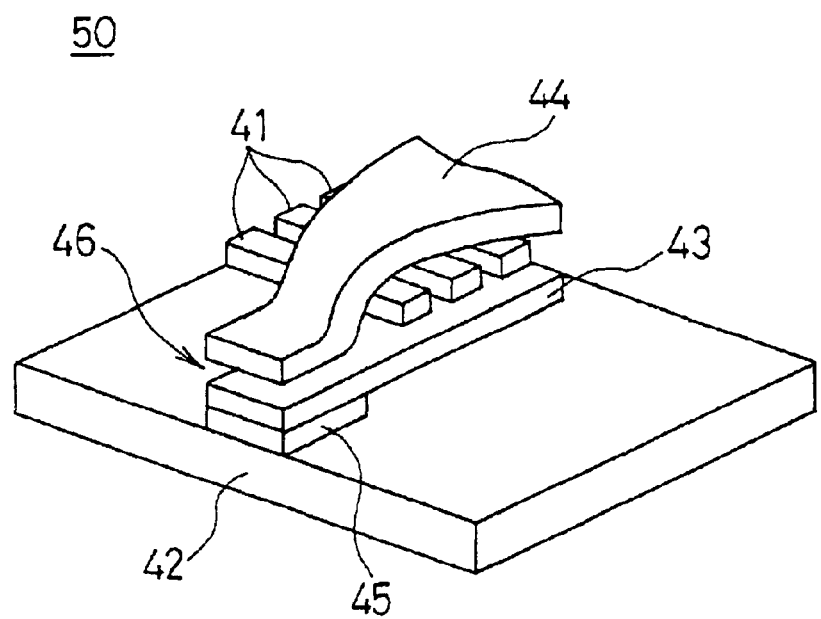
FIG. 14 is a conceptual drawing of a recording and playback head to which the present invention is applied.

FIG. 14 is a conceptual drawing of a recording and playback head 50 to which the present invention has been applied. The head 50 is formed by a playback head 45, a magnetic pole 43, a coil 41, and an upper magnetic pole 44, formed on a base 42.

In forming this head, the upper shield film and lower magnetic film can be one and the same or can be provided separately. This head writes a signal onto a magnetic medium, and reads a signal from a magnetic medium.

By forming the sensing part of the playback head and the magnetic gap of the recording head so that they are superposed over one another on one and the same slider, it is possible to position them on a rack simultaneously. This head was machined on a slider and mounted in a magnetic recording and playback apparatus.

Figure 15:
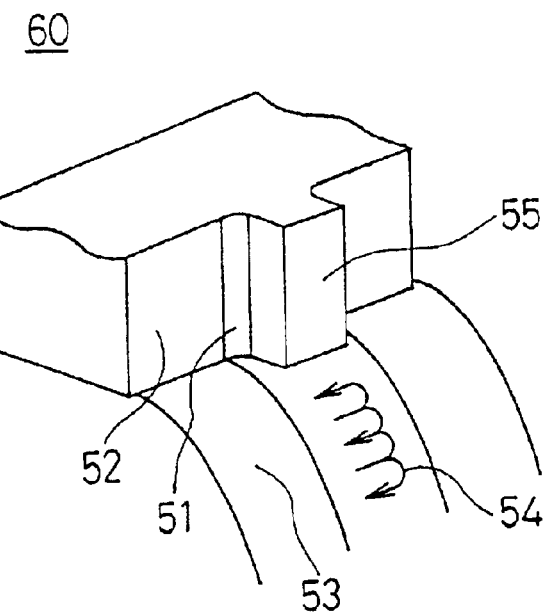
FIG. 15 is a conceptual drawing of a magnetic recording and playback apparatus using a magnetoresistive effect element according to the present invention.

FIG. 15 is a conceptual drawing of a magnetic recording and playback apparatus 60 using a magnetoresistive effect element 30 according to the present invention. The playback head 52 and the recording head 55 are formed on a substrate 52, which serves also as a head slider, this being positioned over a recording medium 53 to as to perform playback.

The recoding medium 53 rotates, and the head slider moves relative to and in opposition thereto, either at a height of 0.2 µm or less, or in direct contact therewith. According to this mechanism, the playback head 51 is set at a position at which it is possible for it to read a magnetic signal recorded on the recording medium 53 by means of the associated leakage magnetic flux 54.

Figure 16:
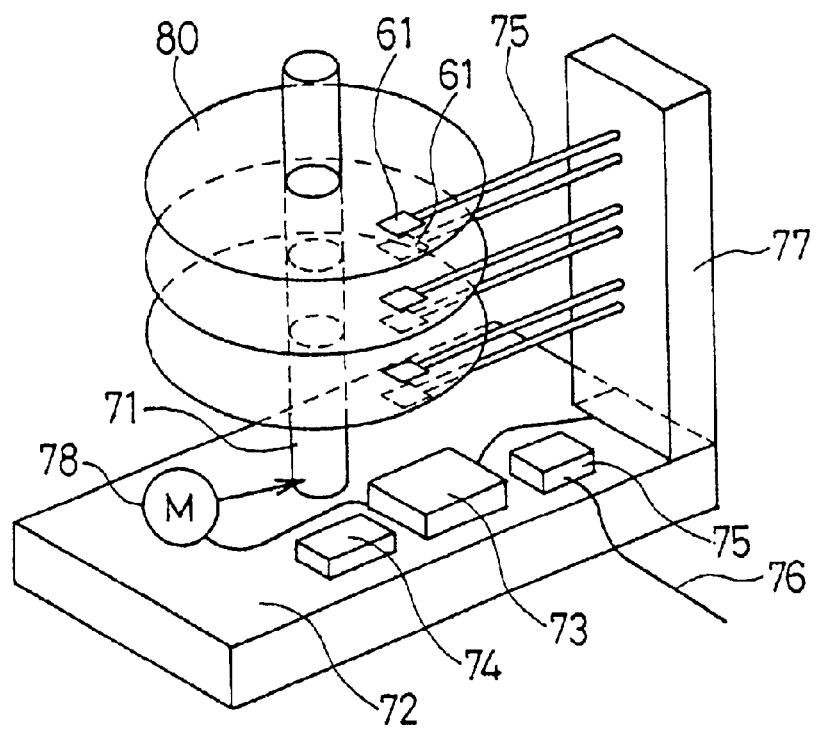
FIG. 16 is a drawing showing an embodiment of the configuration of a magnetic disk using a magnetoresistive effect sensor according to the present invention.

A prototype magnetic disk apparatus to which the present invention is applied is described below, with reference made to FIG. 16.

Specifically, a magnetic disk apparatus 100 according to the present invention has three magnetic disks, for example, over an appropriate base 72, a head drive circuit 73 and a signal processing circuit 74 and input/output interface 75 being housed on the rear side of the base 72.

Connection to the outside is made via a 32-bit bus line 76. One head is disposed on each side of a magnetic disk 80, so that there are a total of six heads 61.

A rotary actuator 77, the associated drive and control circuit 74, as well as a spindle direct drive motor 78 are provided for the purpose of driving the head 60.

The diameter of the disk 80 is 46 mm, and the data surface diameter ranges from 10 mm to 40 mm. A buried servo system is used, so that there is no dedicated servo surface, thereby enabling the achievement of high density.

The apparatus 100 can be connected directly to a small computer for use as an external storage device therefor. The input/output interface 76 has a cache memory, and can accommodate a bus line having a transfer rate in the range of 5 to 20 MB per second.

It is possible to provide an external controller and connect a plurality of this apparatus thereto, so as to configure a large-capacity magnetic disk storage apparatus.

The results of fabricating magnetic heads using a magnetoresistive effect sensor according to the present invention under various conditions and comparing the associated characteristics values are described below.

Specifically, a magnetic head 30 having a configuration as shown in FIG. 6 was fabricated using the various lower shield materials noted below.

When doing this, Ta (3 nm)/Ni82Fe18 (5 nm)/Co90Fe10 (1 nm)/Al oxide (0.7 nm) Co90Fe10 (3 nm)/Ru (0.75 nm)/Co90Fe10 (3 nm)/Pt46Mn54 (20 nm)/Ta (3 nm) was used as the tunnel junction film.

After forming the film, heat treating was performed for 5 hours at 270° C. in a magnetic field of 500 Oe in a direction perpendicular to the direction of the magnetic field at the time of film formation. The following were used as the various elements of the head.

Base

Alumina-TiC having a thickness of 2 mm, onto which is laminated alumina to a thickness of 3 mm Lower Shield Layer NiFe, CoFeB, CoZrMo, CoZrNb, CoZr, ZoZrTa, CoZrTaCr, CoHf, CoTa, CoTaHf, CoNbHf, CoZrNb, CoHfPd, CoTaZrNb, and CoZrMoNi having a thickness of 1 µm Lower Conductor Layer Au (15 nm), Ag (15 nm), Cu (15 nm), Mo (15 nm), W (15 nm), Y (15 nm), Ti (15 nm), Zr (15 nm), Hf (15 nm), V (15 nm), Cr (15 nm), Mn (15 nm), Nb (15 nm), Tc (15 nm), Ru (15 nm), Rh (15 nm), Pd (15 nm), Re (15 nm), Os (15 nm), Ir (15 nm), Ta (15 nm), Pt (15 nm), Ta (5 nm)/Ti (5 nm)/Ta (5 nm), Ta (5 nm)/Zr (5 nm)/Ta (5 nm), Ta (5 nm)/Hf (5 nm)/Ta (5 nm), Zr (5 nm)/Ta (5 nm)/Zr (5 nm), Zr (5 nm)/Hf (5 nm)/Zr (5 nm), Ti (5 nm)/Zr (5 nm)/Ta (5 nm)

Upper Shield Layer

Co89Zr4Ta4Cr3 having a thickness of 1 µm

Insulation Film

Alumina having a thickness of 30 nm

Vertical Bias Layer

Cr (10 nm)/Co74, 5Cr10, 5Pt15 (25 nm)

Lower Gap LayerNone

Upper Gap LayerNone

Upper Layer None

These heads where then subjected to processing to fabricate a combination recording/playback head and slider machining, and were used to record and play back data on a CoCrTa medium. When doing this, the writing track width was 3 µm, the writing gap was 0.2 µm, and the writing track width was 2 µm. The photoresist processing using IR and milling were used to process the TMR element part. In fabricating the coil part of the write head, the photoresist curing process was performed at 250° C. for 2 hours.

In this processing, because of rotation of the fixed layer and the fixing layer magnetization directions that should normally be facing in the element height direction, thereby preventing proper operation as a magnetoresistive effect element, after completion of the fabrication of the playback head and the recording head, magnetization heat treating is performed at 200° C. in a magnetic field of 500 Oe.

By means of this magnetization heat treating, the rotation of the easy magnetization axis of the free layer toward the magnetizing direction was almost unobserved.

The coercivity of the medium was 3.0 kOe, and the MRT was 0.35 emu/cm$^2$.

The above-noted prototype heads were used to measure the playback output, the S/N ratio, the frequency at which the playback output is halved, and the bit error rate.

The results of these measurements are shown in Table 1.

Specifically, Table 1 shows the change in playback output, the S/N ratio, the frequency at which the playback output is halved, and the bit error rate values for the cases of using various lower shield materials.

The lower shields used in these measurements were investigated using X-ray and transmission SEMs, whereupon it was observed that, in comparison with the case of NiFe, in which the crystal grains are 20 to 40 nm, in the cases of CoFeB, CoZrMo, CoZrNb, CoZr, CoZrTa, CoZrTaCr, CoHf, CoTa, CoTaHf, CoNbHf, CoZrNb, CoHfPd, CoTaZrNb, and CoZrMoNi, the structure is either amorphous, which does not have a crystalline structure, or microcrystalline, with a crystal grain diameter of 5 nm or smaller.

The case of NiFe is the case of the past, and all other cases are cases in which the present invention is applied. Ta (5 nm)/Ti (5 nm)/Ta (5 nm) was used as the lower conductor layer.

In comparison with using NiFe as the lower shield as in the past, in the case of the present invention it can be seen that using any material listed in the table as the lower shield results in great improvements in the playback output, the S/N ratio, and the bit error rate.

Of the cases in which the present invention is applied, however, a difference is observed in the playback characteristics according to the type of material, and in the case of the lower shield materials CoZrTa and CoZrTaCr, compared with other materials, the playback output, S/N ratio, frequency at which the playback output is halved, and the bit error rate are improved.

In the cases of CoZrTa and CoZrTaCr, it is possible to obtain a good amorphous material, even if the additive amounts of non-magnetic materials Zr, Ta and Cr with respect to the magnetic material Cr are small, and as a result it is possible to achieve a larger saturation magnetization in the lower shield material than with other amorphous materials.

The fact that the frequency at which the playback output is halved is better than for other amorphous materials is thought to because of the larger saturation magnetization, which improves the performance of absorbing an excess magnetic field when the lower shield acts as a shield, thereby resulting in an improvement in the resolving power of the playback head.

The fact that the playback output, S/N ratio, and bit error rate for CoZrTa and CoZrTaCr were better than for other amorphous materials is thought to be because the materials are better as amorphous materials, and have a flat surface.

Table 2 shows the characteristics values of the playback output, the S/N ratio, the frequency at which the playback output is halved, and the bit error rate with the lower shield made of CoZrTaCr in all cases, but with the crystal grain diameter varied.

The crystal grain diameter was adjusted by changing the Ta composition. Ta (5 nm)/Ti (5 nm)/Ta (5 nm) was used as the lower conductor layer.

As is clear from the results shown in Table 2, with an increase in the crystal grain diameter in the lower shield, although there is no change in the frequency at which the playback output is halved, there is a reduction in the playback output, the S/N ratio, and the bit error rate, this reduction becoming prominent when the crystal grain diameter exceeds 6.2 nm.

Table 3 shows the characteristics values of the playback output, the S/N ratio, the frequency at which the playback output is halved, and the bit error rate with the lower shield made of amorphous CoZTaCr (1 μm) in all cases, but with the crystal grain diameter of the lower conductor layer varied.

The crystal grain diameter of the lower conductor layer was adjusted by varying the type of material forming the lower conductor layer, and the argon gas pressure and target input power when performing sputtering.

As is clear from Table 3, when the crystal grain diameter in the lower conductor layer exceeds 6.2 nm, although there is no change in the frequency at which the playback output is halved, there is a prominent reduction in the playback output, the S/N ratio, and the bit error rate.

As noted above, the general description presented was for a magnetoresistive effect sensor 30 and a method for manufacturing same according to the present invention and the method of manufacturing the magnetoresistive effect sensor can be again summarized as a method for manufacturing a magnetoresistive effect sensor, wherein a shielded-type magnetoresistive effect element in which a sensing current flows substantially perpendicular to a magnetoresistive effect film is formed using a magnetoresistive effect film having a basic configuration that is either a combination of a free layer, a barrier layer formed on the free layer, and a fixed layer formed on the free layer, or a combination of a fixed layer, a barrier layer formed on the fixed layer, and a free layer formed on the barrier, wherein an amorphous material or microcrystalline material is used in a lower shield layer, in which method it is desirable that the crystal grain diameter of a microcrystalline material used in the lower shield be made 6.2 nm or smaller, and preferable that the lower shield be formed by sputtering.

Additionally, in the present invention it is preferable that a magnetoresistive effect film having a basic configuration that is either a combination of a free layer, a barrier layer formed on the free layer, and a fixed layer formed on the barrier layer or a combination of a fixed layer, a barrier layer formed on the fixed layer, and a free layer formed on the barrier layer be either formed directly on the lower shield layer or formed thereon with an intervening base layer.

It is also preferable in the present invention that a lower shield layer be formed and that a lower conductor be formed on the lower shield layer, and that a magnetoresistive effect film having as a basic configuration either a combination of a free layer, a barrier layer formed on the free layer, and a fixed layer, or a combination of a fixed layer, a barrier layer formed on the fixed layer, and a free layer be formed on the lower conductor layer with an intervening base layer.

It is also preferable in the present invention that a magnetoresistive effect film having as a basic configuration either a combination of a free layer, a barrier layer formed on the free layer, and a fixed layer, or a combination of a fixed layer, a barrier layer formed on the fixed layer, and a free layer be either formed directly onto a lower conductor layer or on the lower conductor layer with a base layer intervening therebetween, the lower conductor layer being made of an amorphous material or of a microcrystalline material.

In the present invention, it is preferable that the crystal grain diameter in the lower conductor layer be 5.4 nm or smaller.

In the present invention, it is further possible to form a layer that fixes the magnetization of the fixed layer be formed so as to be in contact with the fixed layer.

By adopting the technical constitutions described in detail above, a magnetoresistive effect sensor and a method for manufacturing a magnetoresistive effect sensor according to the present invention, in comparison with a structure of the past, enable the achievement of a magnetoresistive effect element, a playback head, and a recording and playback apparatus with an improved playback output, S/N ratio, and bit error rate.

TABLE 1

| LOWER SHIELD MATERIAL TYPE (COMPOSITIONS ARE ALL THE COMPOSITIONS (AT/%) OF THE SPUTTERING TARGET) | PLAYBACK OUTPUT (mV) | S/N (dB) | FREQUENCY AT WHICH THE PLAYBACK OUTPUT IS HALVED (KFCI) | BIT ERROR RATE |
|---|---|---|---|---|
| NiFe (EXAMPLE OF THE PAST) | 1.8 | 24 | 250 | APPROX. $1 \times 10^{-5}$ |
| Co77Fe8B15 | 3.1 | 31 | 260 | APPROX. $6 \times 10^{-7}$ |
| Co84Zr6Mo10 | 3.0 | 30 | 250 | APPROX. $7 \times 10^{-7}$ |
| Co84Zr6Nb10 | 3.0 | 30 | 250 | APPROX. $8 \times 10^{-7}$ |
| Co80Zr20 | 2.8 | 29 | 250 | APPROX. $1 \times 10^{-6}$ |
| Co92Zr4Ta4 | 3.4 | 34 | 330 | $1 \times 10^{-7}$ OR LESS |
| Co91Zr5Ta4 | 3.3 | 34 | 330 | $1 \times 10^{-7}$ OR LESS |
| Co90Zr5Ta5 | 3.5 | 35 | 320 | $1 \times 10^{-7}$ OR LESS |
| Co90Zr4Ta4Cr2 | 3.4 | 34 | 320 | $1 \times 10^{-7}$ OR LESS |
| Co91Zr4Ta4Cr1 | 3.5 | 35 | 330 | $1 \times 10^{-7}$ OR LESS |
| Co92Zr3Ta3Cr2 | 3.5 | 34 | 320 | $1 \times 10^{-7}$ OR LESS |
| Co80Hf20 | 2.8 | 30 | 260 | APPROX. $9 \times 10^{-7}$ |
| Co78Ta22 | 2.8 | 29 | 260 | APPROX. $8 \times 10^{-7}$ |
| Co82Ta10Hf8 | 3.1 | 31 | 250 | APPROX. $5 \times 10^{-7}$ |
| Co82Hf10Pb8 | 3.1 | 32 | 260 | APPROX. $4 \times 10^{-7}$ |
| Co84Ta8Zr4Nb4 | 3.0 | 32 | 260 | APPROX. $6 \times 10^{-7}$ |
| Co80Zr8Mo8Ni4 | 3.0 | 32 | 270 | APPROX. $6 \times 10^{-7}$ |

TABLE 2

| LOWER SHIELD CRYSTAL GRAIN DIAMTER (nm) | PLAYBACK OUTPUT (mV) | S/N (dB) | FREQUENCY AT WHICH THE PLAYBACK OUPUT IS HALVED (KFCI) | BIT ERROR RATE |
|---|---|---|---|---|
| 0 (AMORPHOUS) | 3.6 | 34 | 310 | $1 \times 10^{-6}$ OR LESS |
| 3.0 | 3.5 | 34 | 300 | $1 \times 10^{-6}$ OR LESS |
| 4.2 | 3.5 | 34 | 310 | $1 \times 10^{-6}$ OR LESS |
| 4.9 | 3.3 | 33 | 310 | $1 \times 10^{-6}$ OR LESS |
| 6.2 | 2.7 | 29 | 300 | $1 \times 10^{-6}$ OR LESS |
| 7.1 | 2.2 | 25 | 300 | $6 \times 10^{-5}$ |
| 8.3 | 2.1 | 25 | 310 | $4 \times 10^{-5}$ |
| 9.7 | 1.9 | 24 | 300 | $1 \times 10^{-5}$ |

TABLE 3

| LOWER CONDUCTOR LAYER CRYSTAL GRAIN DIAMETER (nm) | LOWER CONDUCTOR LAYER MATERIAL TYPE | PLAYBACK OUTPUT (mV) | S/N (dB) | FREQUENCY AT WHICH THE PLAYBACK OUTPUT IS HALVED | BIT ERROR RATE |
|---|---|---|---|---|---|
| 2.8 | Ta(5 nm)/Ti(5 nm)/Ta(5 nm) | 3.6 | 34 | 310 | $1 \times 10^{-6}$ OR LESS |
| 2.9 | Ta(5 nm)/Zr(5 nm)/Ta(5 nm) | 3.5 | 34 | 310 | $1 \times 10^{-6}$ OR LESS |
| 2.9 | Ta(5 nm)/Hf(5 nm)/Ta(5 nm) | 3.5 | 34 | 310 | $1 \times 10^{-6}$ OR LESS |
| 3.1 | Zr(5 nm)/Ta(5 nm)/Zr(5 nm) | 3.6 | 33 | 310 | $1 \times 10^{-6}$ OR LESS |
| 3.3 | Zr(5 nm)/Hf(5 nm)/Zr(5 nm) | 3.6 | 34 | 300 | $1 \times 10^{-6}$ OR LESS |
| 3.4 | Ti(5 nm)/Zr(5 nm)/Ta(5 nm) | 3.5 | 34 | 310 | $1 \times 10^{-6}$ OR LESS |
| 4.2 | Ru(15 nm) | 3.2 | 30 | 310 | $1 \times 10^{-6}$ OR LESS |
| 4.3 | Rh(15 nm) | 3.2 | 29 | 320 | $1 \times 10^{-6}$ OR LESS |
| 4.3 | Tc(15 nm) | 3.3 | 30 | 310 | $1 \times 10^{-6}$ OR LESS |
| 4.4 | Os(15 nm) | 3.1 | 31 | 310 | $1 \times 10^{-6}$ OR LESS |
| 4.5 | Y(15 nm) | 3.1 | 30 | 320 | $1 \times 10^{-6}$ OR LESS |
| 4.5 | Re(15 nm) | 3.2 | 31 | 300 | $1 \times 10^{-6}$ OR LESS |
| 4.5 | Nb(15 nm) | 3.2 | 31 | 300 | $1 \times 10^{-6}$ OR LESS |
| 4.6 | V(15 nm) | 3.1 | 31 | 310 | $1 \times 10^{-6}$ OR LESS |
| 4.6 | Hf(15 nm) | 3.0 | 30 | 310 | $1 \times 10^{-6}$ OR LESS |
| 4.6 | W(15 nm) | 3.1 | 31 | 300 | $1 \times 10^{-6}$ OR LESS |

TABLE 3-continued

| LOWER CONDUCTOR LAYER CRYSTAL GRAIN DIAMETER (nm) | LOWER CONDUCTOR LAYER MATERIAL TYPE | PLAYBACK OUTPUT (mV) | S/N (dB) | FREQUENCY AT WHICH THE PLAYBACK OUTPUT IS HALVED | BIT ERROR RATE |
|---|---|---|---|---|---|
| 4.7 | Cr(15 nm) | 3.2 | 29 | 300 | $1 \times 10^{-6}$ OR LESS |
| 4.7 | Ta(15 nm) | 3.2 | 31 | 310 | $1 \times 10^{-6}$ OR LESS |
| 4.7 | Ti(15 nm) | 3.2 | 30 | 310 | $1 \times 10^{-6}$ OR LESS |
| 4.8 | Zr(15 nm) | 3.3 | 30 | 310 | $1 \times 10^{-6}$ OR LESS |
| 4.8 | Mn(15 nm) | 2.9 | 30 | 300 | $1 \times 10^{-6}$ OR LESS |
| 4.8 | Pb(15 nm) | 3.2 | 31 | 310 | $1 \times 10^{-6}$ OR LESS |
| 4.9 | Ir(15 nm) | 3.2 | 30 | 310 | $1 \times 10^{-6}$ OR LESS |
| 4.9 | Mo(15 nm) | 3.1 | 30 | 320 | $1 \times 10^{-6}$ OR LESS |
| 4.9 | Pt(15 nm) | 3.2 | 31 | 310 | $1 \times 10^{-6}$ OR LESS |
| 5.5 | Ta(15 nm) | 2.2 | 25 | 310 | $2 \times 10^{-6}$ |
| 5.7 | Zr(15 nm) | 2.3 | 26 | 300 | $1 \times 10^{-6}$ |
| 6.0 | Hf(15 nm) | 2.1 | 25 | 310 | $3 \times 10^{-6}$ |
| 8.0 | Cu(15 nm) | 2.1 | 25 | 310 | $5 \times 10^{-5}$ |
| 9.2 | Ag(15 nm) | 1.9 | 24 | 300 | $1 \times 10^{-5}$ |
| 12.2 | Au(15 nm) | 1.8 | 24 | 310 | $7 \times 10^{-5}$ |

What is claimed is:

1. A magnetoresistive effect sensor using a shielded-type magnetoresistive effect element comprising:

a magnetoresistive effect film above a lower shield layer, said film comprising a basic configuration that is a combination of a free layer, a barrier layer, and a fixed layer, wherein either said barrier layer is formed on said free layer, and said fixed layer is formed on said barrier layer, or said barrier layer is formed on said fixed layer, and said free layer is formed on said barrier layer, said barrier layer inheriting a roughness of said lower shield layer, wherein a sensing current flows substantially perpendicularly with respect to said magnetoresistive effect film, and wherein a microcrystalline material is used in said lower shield layer so as to smooth said lower shield layer, thereby increasing the smoothness of said barrier layer, wherein said lower shield layer comprises a crystal grain diameter of 6.2 nm or smaller.

2. A magnetoresistive effect sensor according to claim 1, wherein said lower shield layer is formed by means of sputtering.

3. A magnetoresistive effect sensor according to claim 1, wherein said magnetoresistive effect film is formed on said lower shield layer directly or formed thereon via an intervening base layer.

4. A magnetoresistive effect sensor according to claim 1, wherein a lower conductor layer is disposed at a bottom part of said magnetoresistive effect film, said bottom part of said lower conductor layer being in contact with said lower shield layer.

5. A magnetoresistive effect sensor according to claim 1, further comprising a layer which fixes a magnetization of a fixed layer, provided so as to be in contact with said fixed layer.

6. A magnetoresistance detection system comprising a magnetoresistive effect sensor according to claim 1, a means for generating a current passing through said magnetoresistive effect sensor, and means for detecting a change in magnetoresistance of said magnetoresistive effect sensor as a function of a detected magnetic field.

7. A magnetic recording system comprising a magnetic storage medium comprising a plurality of tracks for data recording, a magnetic recording element for storing data on said magnetic storage medium, a magnetoresistance detection system according to claim 6, and an actuating means connected to said magnetic recording element and a magnetoresistance conversion system for the purpose of causing said magnetic recording element and said magnetoresistance detection system to move to a selected track of said magnetic storage medium.

* * * * *